(12) United States Patent
Li

(10) Patent No.: US 7,728,330 B2
(45) Date of Patent: Jun. 1, 2010

(54) CMOS IMAGER WITH NITRIDED GATE OXIDE AND METHOD OF FABRICATION

(75) Inventor: Jiutao Li, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 1126 days.

(21) Appl. No.: 11/209,778

(22) Filed: Aug. 24, 2005

(65) Prior Publication Data

US 2007/0052054 A1 Mar. 8, 2007

(51) Int. Cl.
*H01L 29/04* (2006.01)

(52) U.S. Cl. .................... 257/59; 257/291; 257/292; 257/369

(58) Field of Classification Search .............. 257/59, 257/291, 292, 369
See application file for complete search history.

(56) References Cited

U.S. PATENT DOCUMENTS

| | | | |
|---|---|---|---|
| 5,904,493 | A | 5/1999 | Lee et al. |
| 6,900,507 | B1 | 5/2005 | Hong |
| 2001/0017367 | A1 | 8/2001 | Rotstein |
| 2003/0040171 | A1 | 2/2003 | Weimer |
| 2003/0052377 | A1 | 3/2003 | Weimer |
| 2004/0188597 | A1* | 9/2004 | Inoue et al. .............. 250/214 R |
| 2005/0026348 | A1 | 2/2005 | Weimer |
| 2005/0032393 | A1 | 2/2005 | Weimer |

FOREIGN PATENT DOCUMENTS

JP 11 233750 A 8/1999

OTHER PUBLICATIONS

Nixon, R.H, et al., "256×256 CMOS Active Pixel Sensor Camera-On-A-Chip", IEEE International Solid State Circuits Conference, IEEE Service Center, New York, NY, vol. 39, Feb. 1996, pp. 178-179 and 440.
Partial International Search Report dated May 8, 2007.
International Search Report dated Aug. 28, 2007.
International Preliminary Report on Patentability and Written Opinion dated Mar. 6, 2008 issued in Application No. PCT/US2006/031828.

* cited by examiner

*Primary Examiner*—Long Pham
(74) *Attorney, Agent, or Firm*—Dickstein Shapiro LLP

(57) ABSTRACT

A CMOS imager having reduced dark current and methods of forming the same. A nitrided gate oxide layer having approximately twice the thickness of a typical nitrided gate oxide is provided over the photosensor region of a CMOS imager. The gate oxide layer provides an improved contaminant barrier to protect the photosensor, contains the p+ implant distribution in the surface of the p+ pinned region of the photosensor, and reduces photon reflection at the photosensor surface, thereby decreasing dark current.

19 Claims, 8 Drawing Sheets

CMOS IMAGER WITH NITRIDED GATE OXIDE AND METHOD OF FABRICATION

FIELD OF THE INVENTION

The present invention relates to the field of semiconductor devices, and in particularly, CMOS imagers having reduced dark current.

BACKGROUND OF THE INVENTION

CMOS image sensors are increasingly being used as low cost imaging devices. A CMOS image sensor circuit includes a focal plane array of pixel cells, each one of the cells includes a photogate, photoconductor, or photodiode having an associated charge accumulation region within a substrate for accumulating photo-generated charge. Each pixel cell may include a transistor for transferring charge from the charge accumulation region to a sensing node, and a transistor for resetting the sensing node to a predetermined charge level prior to charge transference. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which describe the operation of conventional CMOS image sensors and are assigned to Micron Technology, Inc., the contents of which are incorporated herein by reference.

A schematic diagram of a conventional CMOS four-transistor (4T) pixel cell 10 is shown in FIG. 1. The CMOS pixel cell 10 generally comprises a photosensor 14 for generating and collecting charge generated by light incident on the pixel cell 10, and a transfer transistor 17 for transferring photoelectric charges from the photosensor 14 to a sensing node, typically a floating diffusion region 5. The floating diffusion region 5 is electrically connected to the gate of an output source follower transistor 19. The pixel cell 10 also includes a reset transistor 16 for resetting the floating diffusion region 5 to a predetermined voltage $V_{aa\text{-}pix}$; and a row select transistor 18 for outputting a signal $V_{out}$ from the source follower transistor 19 to an output terminal in response to an address signal.

FIG. 2 is a cross-sectional view of a portion of the pixel cell 10 of FIG. 1 showing the photo-conversion device 14, transfer transistor 17 and reset transistor 16. The exemplary CMOS pixel cell 10 has a photosensor 14 that may be formed as a pinned photodiode. The photodiode photosensor 14 has a p-n-p construction comprising a p-type surface layer 13 and an n-type photodiode region 12 within a p-type active layer 11. The transfer transistor 17 and reset transistor 16 gates sit on a thin gate oxide layer 15. The photodiode photosensor 14 is adjacent to and partially underneath the transfer transistor 17. The reset transistor 16 is on a side of the transfer transistor 17 opposite the photodiode photosensor 14. As shown in FIG. 2, the reset transistor 16 includes a source/drain region 2. The floating diffusion region 5 is between the transfer and reset transistors 17, 16.

In the CMOS pixel cell 10 depicted in FIGS. 1 and 2, electrons are generated by light incident on the photodiode photosensor 14 and are stored in the n-type photodiode region 12. These charges are transferred to the floating diffusion region 5 by the transfer transistor 17 when the transfer transistor 17 is activated. The source follower transistor 19 produces an output signal based on the transferred charges. A maximum output signal is proportional to the number of electrons extracted from the n-type photodiode region 12.

One common problem associated with conventional imager pixel cells, such as pixel cell 10, is dark current. Dark current is current generated as a photosensor signal in the absence of light. Dark current may be caused by many different factors, including, but not limited to: contaminants that diffuse into the photosensor silicon during the gate-formation steps of pixel fabrication; photosensor junction leakage, i.e., diffusion of ions across the p-n-p layers of the photosensor; and photon reflection at the photosensor surface. Dark current is detrimental to the operation and performance of a photosensor. Accordingly, it is desirable to provide an isolation technique that prevents dark current by providing a contaminant barrier to protect the photosensor that can also contain the underlying ion distribution to maintain the photosensor junction and reduce photon reflection at the photosensor surface.

BRIEF SUMMARY OF THE INVENTION

The present invention provides a CMOS imager having reduced dark current and methods of forming it. A nitrided gate oxide layer having approximately twice the thickness of a typical nitrided gate oxide is provided over the photosensor region of a CMOS imager. The gate oxide layer provides an improved contaminant barrier to protect the photosensor, contains the p+ implant distribution in the surface of the p+ pinned region of the photosensor, and reduces photon reflection at the photosensor surface, thereby decreasing dark current.

BRIEF DESCRIPTION OF THE DRAWINGS

These and other features of the various embodiments of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in and/or over the base semiconductor structure or foundation. In addition, the semiconductor need not be silicon-based, but could be based on silicon-germanium, germanium, or gallium arsenide.

The term "pixel" or "pixel cell" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion. Moreover, while a four-transistor pixel cell is described, the invention is not limited to such an embodiment. The invention may be employed for any pixel cell, such as a two-transistor, three-transistor, five- or more transistor pixel cells and is also not limited to CMOS pixels.

Figure 1:
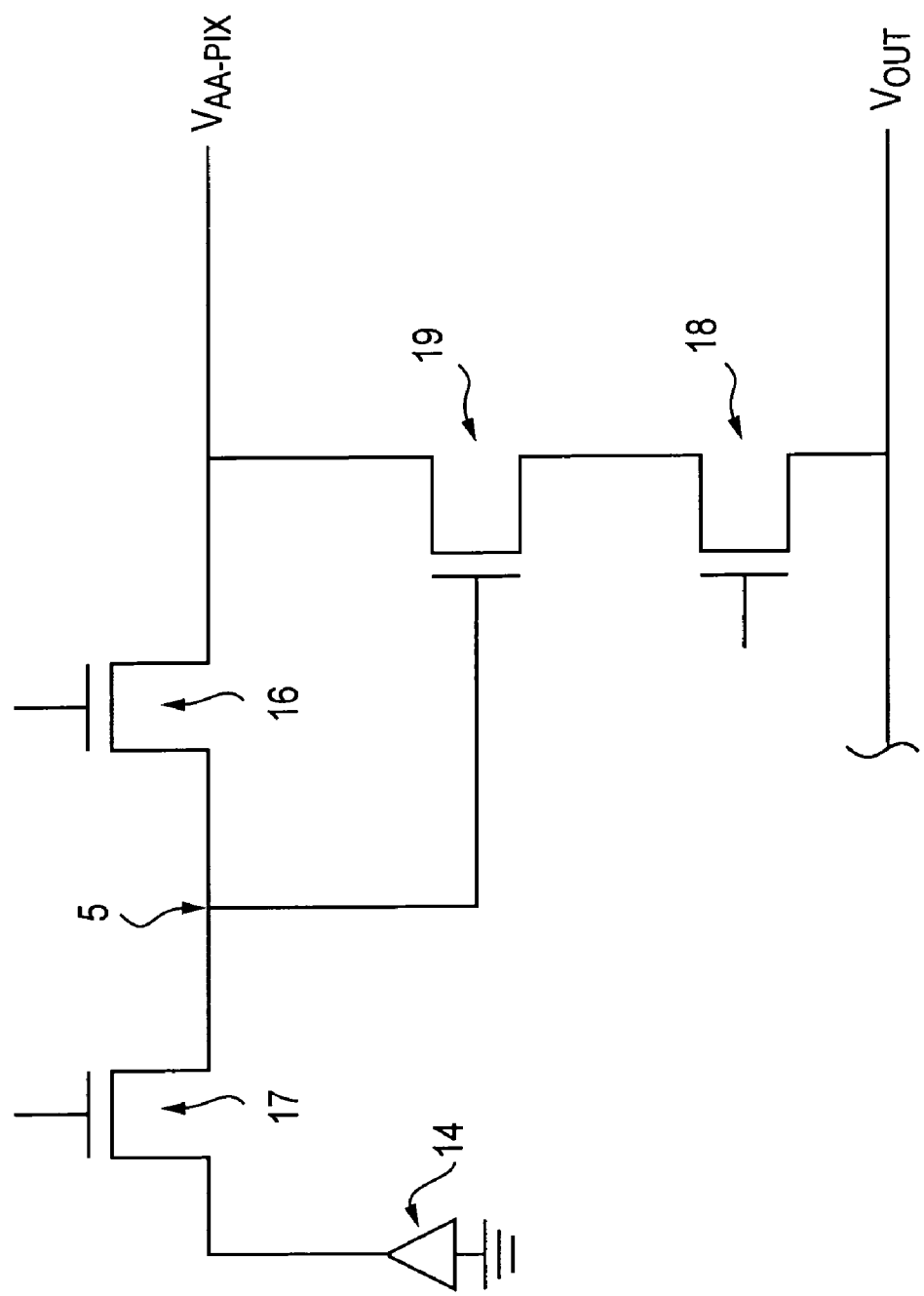
FIG. 1 is a schematic diagram of a four-transistor pixel cell of prior art.
Figure 2:
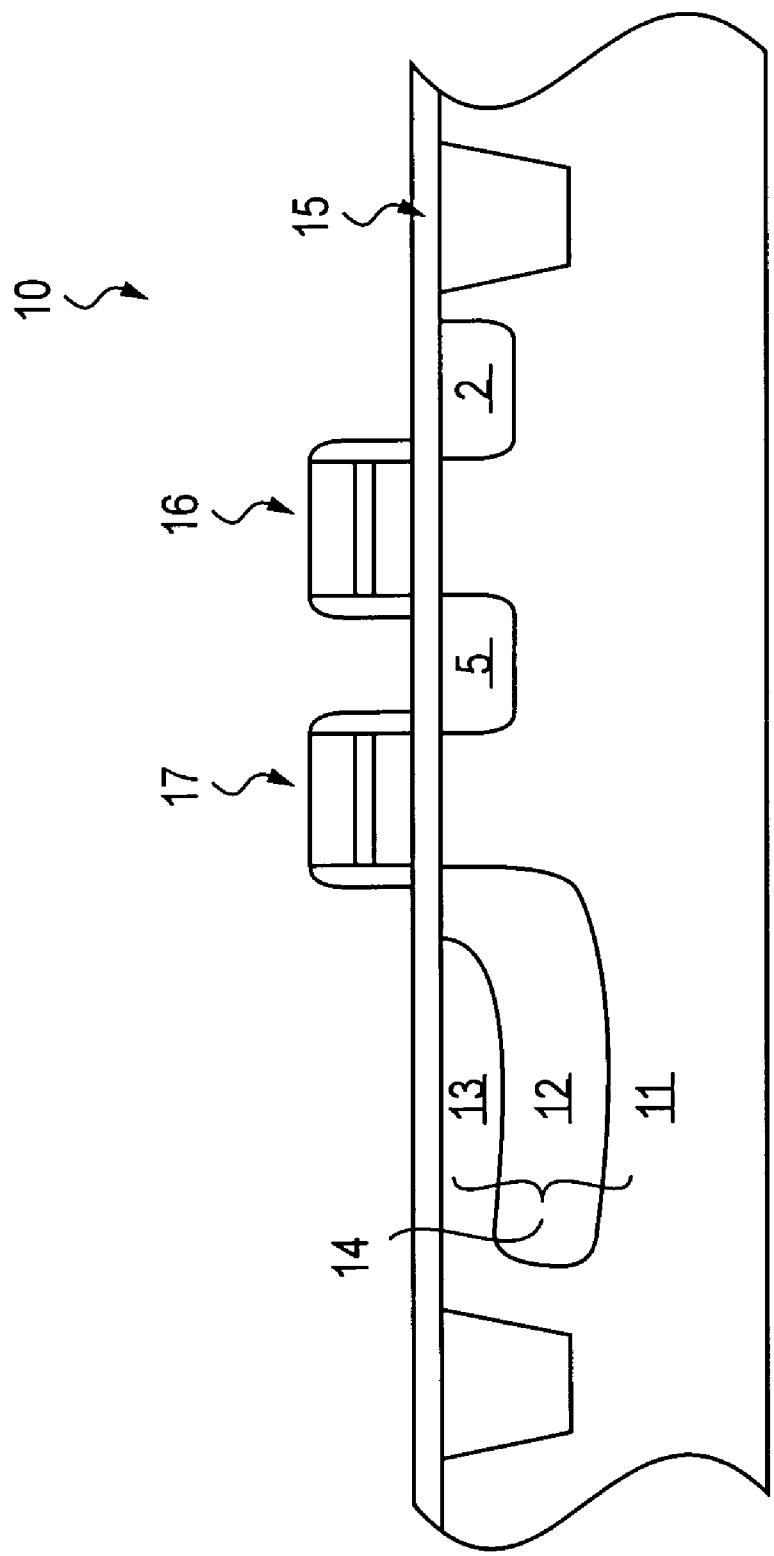
FIG. 2 is a cross-section of the pixel cell of FIG. 1.
Figure 3:
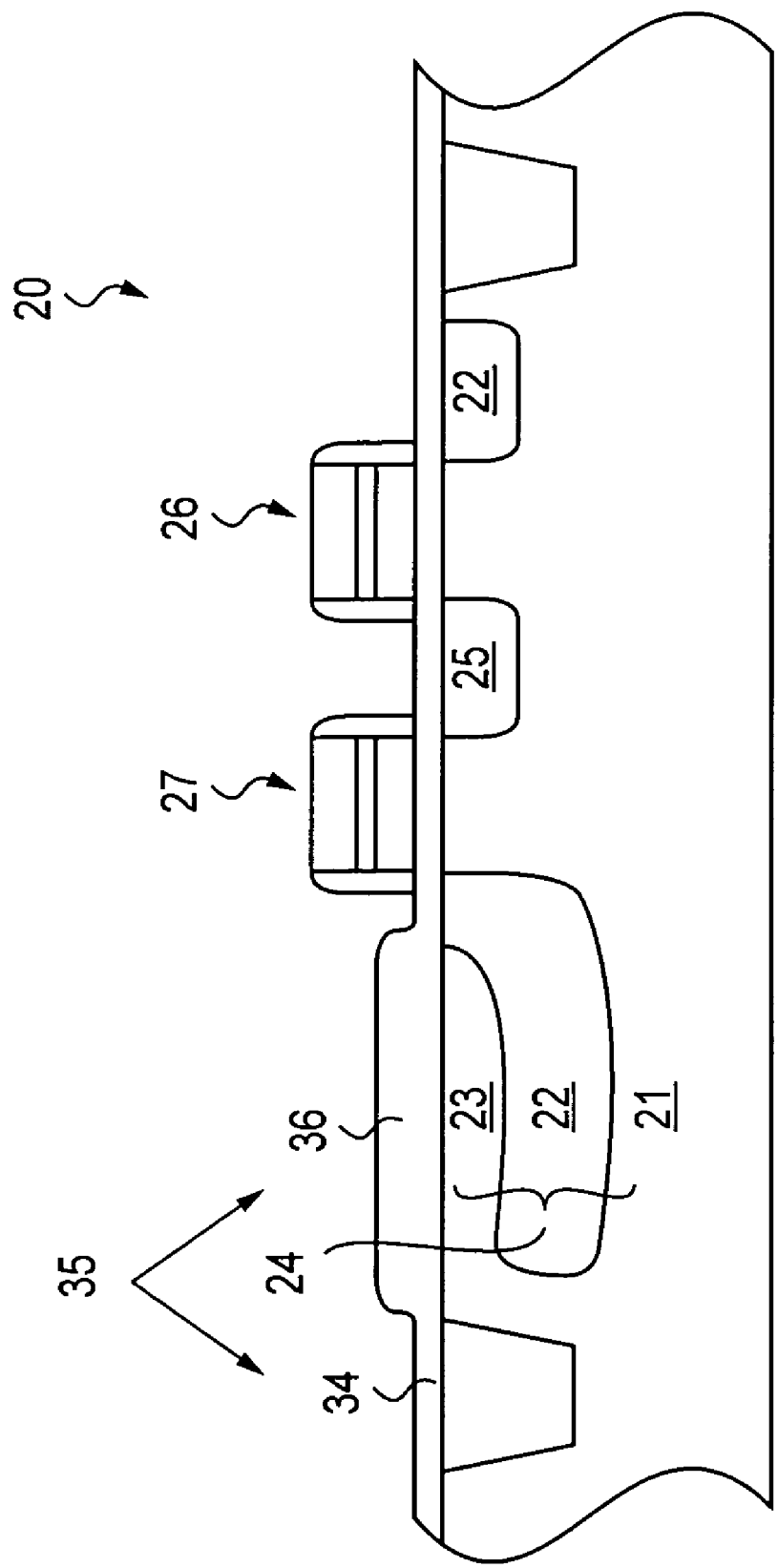
FIG. 3 is a cross-section of a pixel cell according to an exemplary embodiment of the invention.

Referring now to the drawings, where like elements are designated by like reference numerals, FIG. 3 illustrates a cross-section of a pixel cell 20, which is schematically similar to the pixel cell 10 of FIG. 1. The cross-sectional view of pixel cell 20 shows a photodiode photosensor 24, transfer transistor 27 and reset transistor 26. Photodiode photosensor 24 is formed as a pinned photodiode having a p-n-p construction comprising a p-type surface layer 23 and an n-type photodiode region 22 within a p-type active layer 21. The photodiode photosensor 24 is adjacent to and partially underneath the transfer transistor 27. The reset transistor 26 is on a side of the transfer transistor 27 opposite the photodiode photosensor 24. As shown in FIG. 3, the reset transistor 26 includes a source/drain region 22. The floating diffusion region 25 is between the transfer and reset transistors 27, 26.

In pixel cell 20, the transfer transistor 27 and reset transistor 26 gates sit on a gate oxide layer 35. Gate oxide layer 35, which comprises nitrided gate oxide material, has a thicker region 36 located over the photodiode photosensor 24. In its thinner portion, gate oxide layer 35 typically has a thickness in the range of approximately 30 Å to approximately 40 Å, and a nitride concentration of approximately 18%. This may be the same thickness and nitride concentration as gate oxide layer 15 of a pixel cell 10 of the prior art as illustrated in FIG. 1. The thicker region 36 has a thickness of approximately double the thickness of the thinner region 34 of gate oxide layer 35, more preferably, approximately 70 Å and a nitride concentration that is greater by approximately 15-20% than the nitride concentration of thinner region 34, due to its greater thickness.

The advantages of pixel cell 20 over the prior art are many. The thicker region 36 over the photodiode photosensor 24 significantly improves the blocking of contaminants that diffuse into the silicon of photodiode photosensor 24 and increase dark current. This is of particular importance where tungsten (W or $WSi_x$) is to be used in the formation of the gate stacks of transfer transistor 27 and other transistors. The thicker region 36 may be used to block tungsten (W) metal residuals from diffusing into the photodiode silicon after the gates stacks have been formed.

Another advantage of the thicker region 36 over the photodiode photosensor 24 is that it prevents photodiode junction leakage, thereby enhancing charge storage in the photodiode photosensor 24 and, ultimately, charge transfer to the floating diffusion region 25. The thicker region 36 inhibits photodiode junction leakage by maintaining the boron (or other p-type ion) distribution in the p-type surface layer 23, which is over the n-type photodiode region 22.

The thicker region 36 provides a further advantage of reducing photon reflection at the surface of photodiode photosensor 24. The thicker region 36 has a greater index of refraction than the thinner region 34. Increasing the nitride concentration of the gate oxide layer 35 over the photodiode photosensor 24 by increasing the thickness of the gate oxide layer 35 in thicker region 36 also increases the optical refractive index of the gate oxide layer 35, thereby reducing photon reflection and increasing the amount of incident light on the photodiode photosensor 24.

Figure 4:
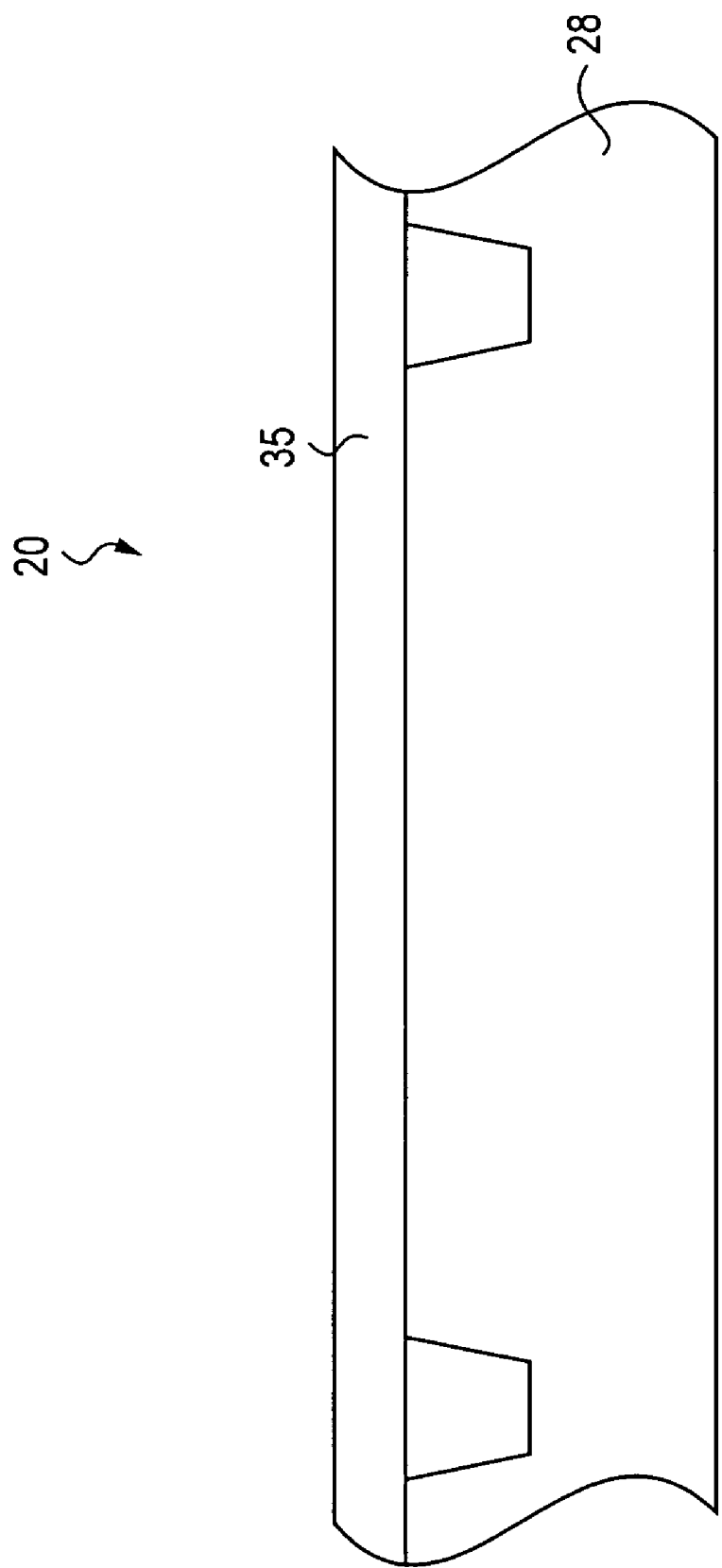
FIG. 4 is a cross-section of a stage of fabrication of a pixel cell according to an exemplary embodiment of the invention.

The present invention requires only a minor change from CMOS imager fabrication processing steps. Referring to FIG. 4, at an early stage of fabrication, nitrided gate oxide layer 35 layer is blanket deposited over the substrate 28 by any known method including, but not limited to, high temperature furnace oxide formation, chemical vapor deposition (CVD), plasma enhanced chemical vapor deposition (PECVD), or sputtering. Whereas, in the prior art process, the nitrided gate oxide layer 35 would have a uniform thickness, the present invention forms a thicker region 36 and a thinner region 34, as shown in FIG. 3.

Figure 5:
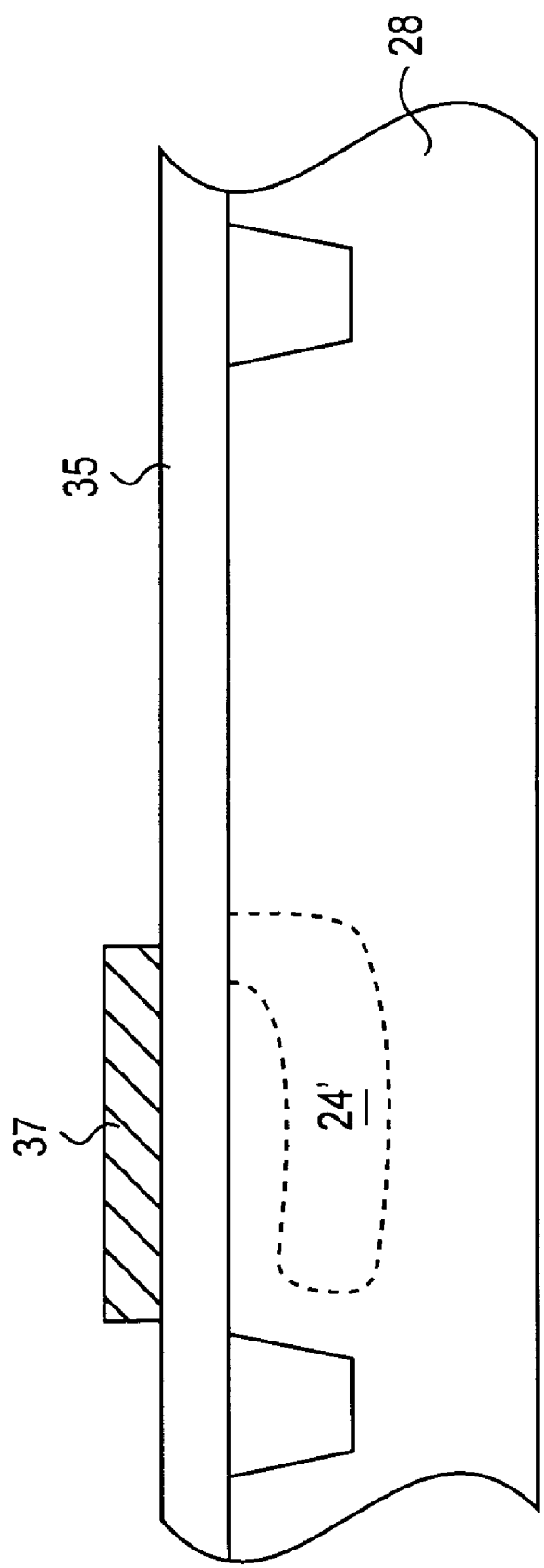
FIG. 5 is a cross-section of a stage of fabrication of the pixel cell subsequent to the FIG. 4 stage.

The thicker region 36 may be formed by methods including, but not limited to, photolithography or reactive ion etching, as shown in FIG. 5. A mask or reticle 37 is patterned to remain over the regions 24' where the photodiode will be formed in later stages of processing.

Figure 6:
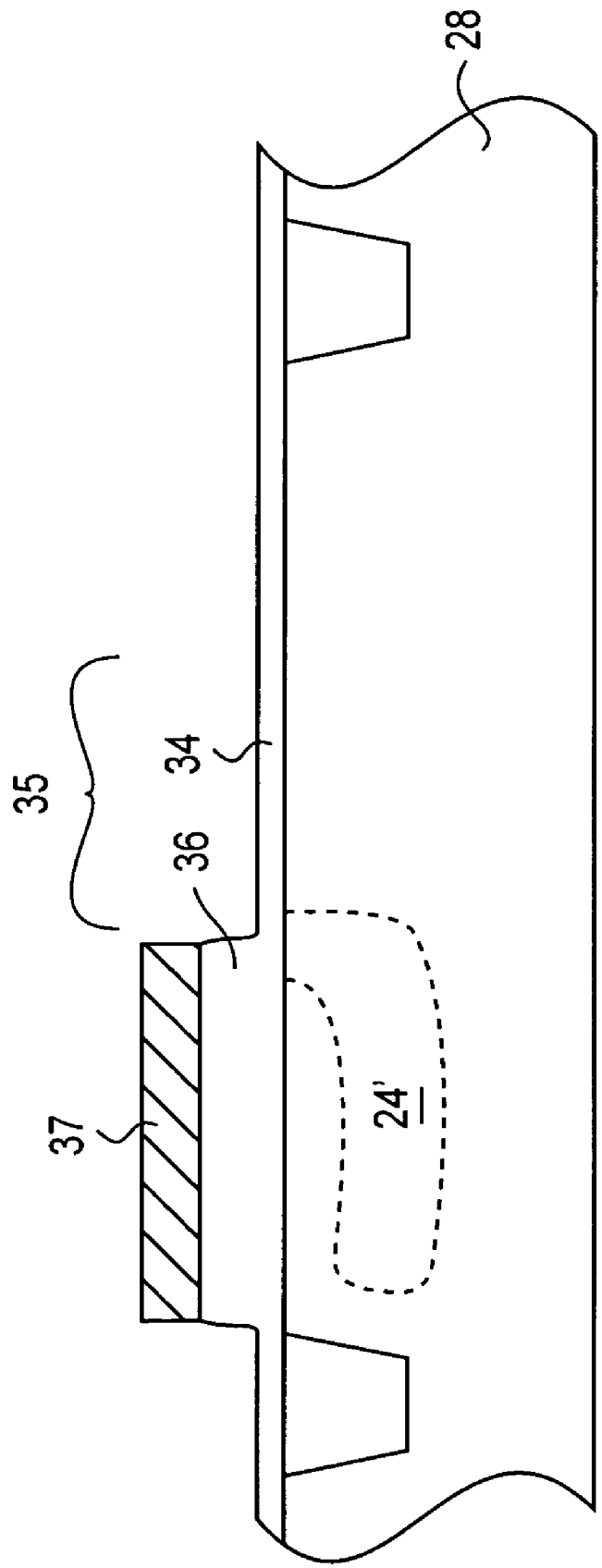
FIG. 6 is a cross-section of a stage of fabrication of a pixel cell subsequent to the FIG. 5 stage.

The exposed portions of the nitrided gate oxide layer 35 are etched away, leaving a thicker region 36 of nitrided gate oxide layer 35 under the mask 37, as illustrated in FIG. 6. The mask 37 is removed and subsequent processing steps to form pixel cell 20 are performed in accordance with known techniques. The subsequent processing steps include, but are not limited to, masking and doping regions for source/drain region 22, photodiode photosensor 24, and floating diffusion region 25 (FIG. 3), and forming gate stacks for transfer transistor 27 and reset transistor 26, among others.

Figure 7:
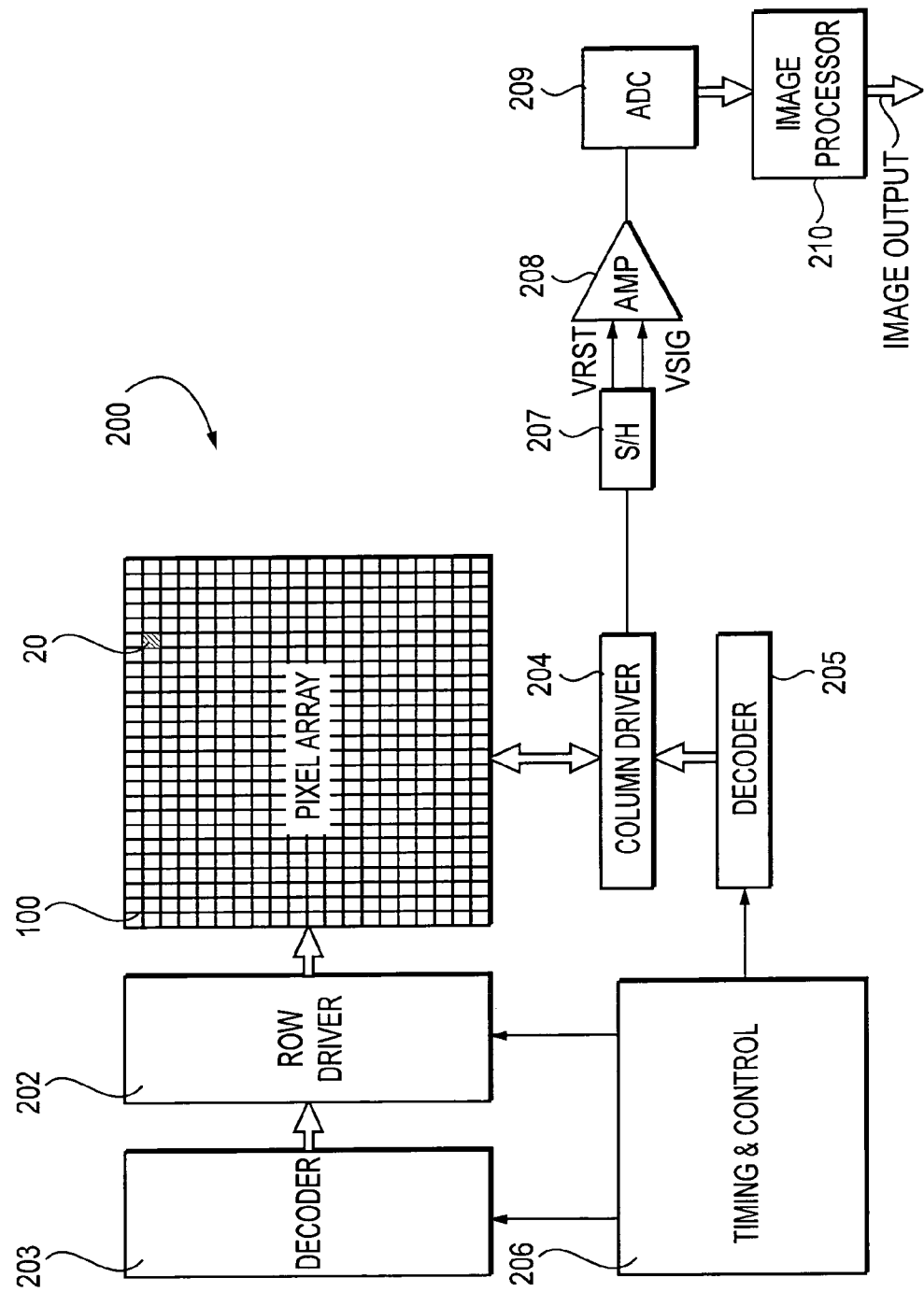
FIG. 7 illustrates an imaging device using a pixel cell constructed in accordance with an embodiment of the invention.

FIG. 7 illustrates an exemplary imaging device 200 that may utilize pixel cells 20 constructed in accordance with the invention. The imaging device 200 has an imager pixel array 100 comprising a plurality of pixel cells constructed as described above. Row lines are selectively activated by a row driver 202 in response to row address decoder 203. A column driver 204 and column address decoder 205 are also included in the imaging device 200. The imaging device 200 is operated by the timing and control circuit 206, which controls the address decoders 203, 205. The control circuit 206 also controls the row and column driver circuitry 202, 204.

A sample and hold (S/H) circuit 207 associated with the column driver 204 reads a pixel reset signal Vrst and a pixel image signal Vsig for selected pixels. A differential signal (Vrst-Vsig) is produced by differential amplifier 208 for each pixel and is digitized by analog-to-digital converter (ADC) 209. The analog-to-digital converter 209 supplies the digitized pixel signals to an image processor 210 which forms and outputs a digital image.

Figure 8:
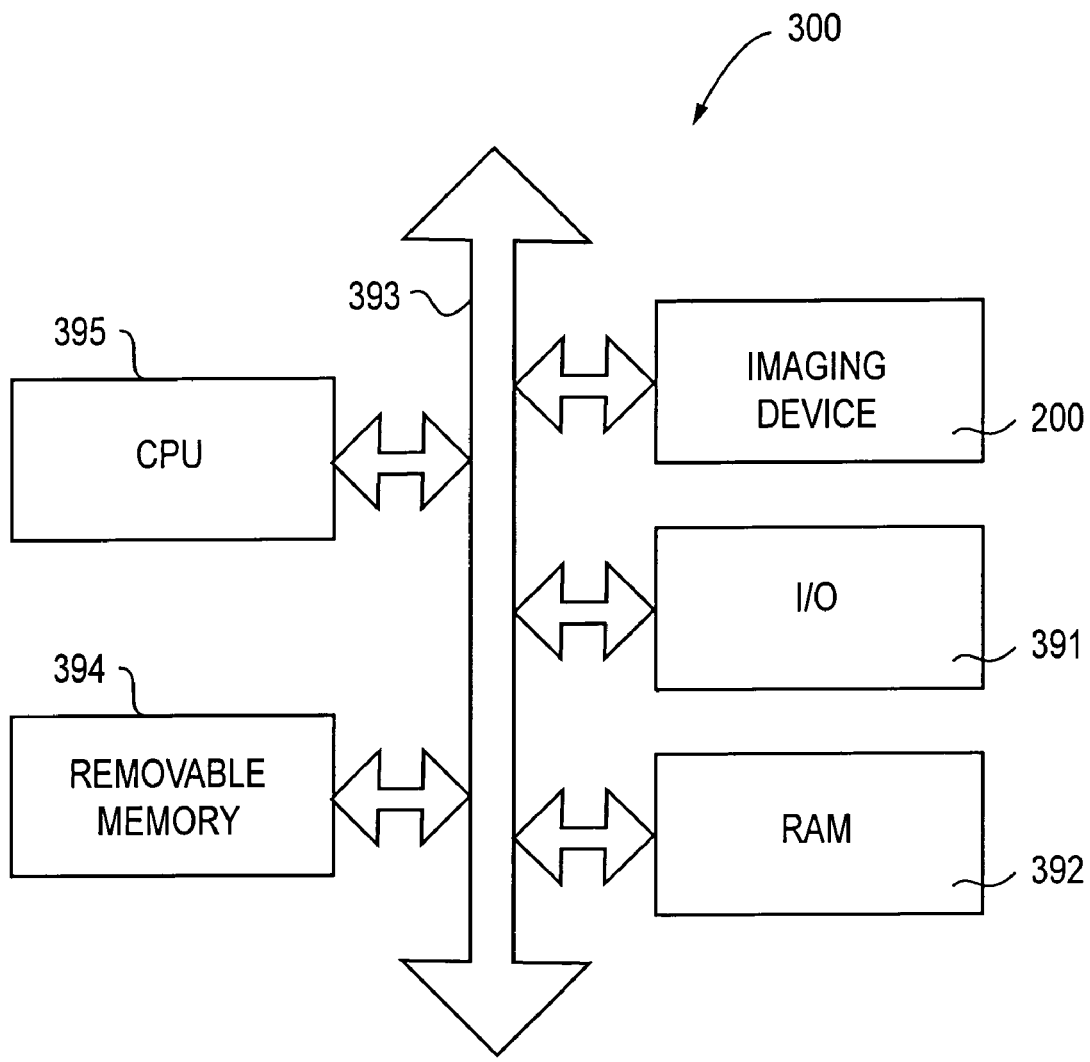
FIG. 8 illustrates a schematic of a processing system including the imaging device of FIG. 7.

FIG. 8 shows a system 300, a typical processor system modified to include the imaging device 200 (FIG. 7) of the invention. The processor-based system 300 is exemplary of a system having digital circuits that could include image sensor devices. Without being limiting, such a system could include a computer system, still or video camera system, scanner, machine vision, vehicle navigation, video phone, surveillance system, auto focus system, star tracker system, motion detection system, image stabilization system, and data compression system.

The processor-based system 300, for example a camera system, generally comprises a central processing unit (CPU) 395, such as a microprocessor, that communicates with an input/output (I/O) device 391 over a bus 393. Imaging device 200 also communicates with the CPU 395 over bus 393. The processor-based system 300 also includes random access memory (RAM) 392, and can include removable memory 394, such as flash memory, which also communicate with CPU 395 over the bus 393. Imaging device 200 may be combined with a processor, such as a CPU, digital signal processor, or microprocessor, with or without memory storage on a single integrated circuit or on a different chip than the processor.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, the thicker region of nitrided gate oxide layer may be formed by forming a first thin layer of gate oxide over the substrate and patterning a second thin layer over the photodiode regions such that the resulting and patterning a second thin layer over the photodiode regions such that the resulting gate oxide layer over the photodiode regions has approximately twice the thickness of the gate oxide layer formed over the rest of the substrate. Accordingly, the invention is not to be seen as limited by the foregoing description, but is only limited by the scope of the appended claims.

What is claimed as new and desired to be protected by Letters Patent of the United States is:

1. A pixel cell comprising:
   a photosensor in a first region of a substrate;
   a nitrided gate oxide layer over said substrate, said nitrided gate oxide layer having a first thickness located over said first region and a second thickness located over a second region of said substrate, wherein said first thickness is approximately twice as thick as said second thickness; and
   a transfer transistor gate stack over said nitrided gate oxide layer over said second region and adjacent said first region.

2. The pixel cell of claim 1, wherein said second thickness is in the range of approximately 30 Å to approximately 40 Å.

3. The pixel cell of claim 1, wherein said first thickness is approximately 70 Å.

4. The pixel cell of claim 1, wherein said nitrided gate oxide layer over said first region of said substrate has a nitride concentration in the range of approximately 15-20% greater than a nitride concentration of said nitrided gate oxide layer over said second region.

5. The pixel cell of claim 1, wherein said nitrided gate oxide layer has a higher index of refraction over said first region than said second region of said substrate.

6. The pixel cell of claim 1, wherein said nitrided gate oxide layer inhibits photosensor junction leakage.

7. The pixel cell of claim 1, wherein said nitrided gate oxide layer blocks contaminants from diffusing into said first region of said substrate.

8. An imager, comprising:
   a pixel array formed in a substrate, said pixel array having a plurality of photosensitive areas in said substrate and a plurality of transistor gate stacks over said substrate;
   a first nitrided gate oxide layer over said substrate and under said plurality of transistor gate stacks; and
   a second nitrided gate oxide layer over said photosensitive areas in said substrate such that a thickness of the first and second nitrided gate oxide layers over said photosensitive areas is greater than a thickness of the first nitrided gate oxide layer under said plurality of transistor gate stacks.

9. The imager of claim 8, wherein said first gate oxide layer has a thickness in the range of approximately 30-40 Å.

10. The imager of claim 8, wherein said first and second gate oxide layers have a combined thickness of approximately 70 Å.

11. The imager of claim 8, wherein said first and second gate oxide layers over said photosensitive areas have a nitride concentration in the range of approximately 15-20% greater than a nitride concentration of said first gate oxide layer alone.

12. An image processor comprising:
   a processor; and
   a pixel array formed in a substrate, said pixel array comprising:
      a plurality of photosensitive areas in a first region of said substrate;
      a nitrided gate oxide layer over said substrate, said gate oxide layer having a first thickness located in said first region and a second thickness located over a second region of said substrate, wherein said first thickness is approximately twice as thick as said second thickness; and
      a plurality of transistor gate stacks over said nitrided gate oxide layer over said second region and adjacent said first region.

13. The image processor of claim 12, wherein at least one of said plurality of photosensitive areas is a buried photodiode.

14. The image processor of claim 12, wherein said second thickness is in the range of approximately 30 Å to approximately 40 Å.

15. The image processor of claim 12, wherein said first thickness is approximately 70 Å.

16. The image processor of claim 12, wherein said gate oxide layer over said first region of said substrate has a nitride concentration in the range of approximately 15-20% greater than a nitride concentration of said gate oxide layer over said second region.

17. The image processor of claim 12, wherein said gate oxide layer has a higher index of refraction over said first region than said second region of said substrate.

18. The image processor of claim 12, wherein said gate oxide layer inhibits junction leakage of said photosensitive areas.

19. The image processor of claim 12, wherein said gate oxide layer blocks contaminants from diffusing into said first region of said substrate.

* * * * *